United States Patent [19]
Le et al.

[11] Patent Number: 5,923,210
[45] Date of Patent: Jul. 13, 1999

[54] HIGH SIDE DRIVER CIRCUIT WITH DIAGNOSTIC OUTPUT

[75] Inventors: Long T. Le, Peoria; Paul C. Gottshall, Washington, both of Ill.

[73] Assignee: Caterpillar Inc., Peoria, Ill.

[21] Appl. No.: 08/852,483

[22] Filed: May 7, 1997

[51] Int. Cl.[6] .................................. G05F 1/10; G05F 3/02
[52] U.S. Cl. ........................ 327/538; 327/108; 327/546
[58] Field of Search .................................. 327/427, 431, 327/432, 434, 437, 440, 478, 483, 475, 538, 540, 541, 543, 546, 576, 581, 389, 52, 63, 90, 108

[56] References Cited

U.S. PATENT DOCUMENTS

| | | | |
|---|---|---|---|
| 5,023,474 | 6/1991 | Wilcox | 327/109 |
| 5,130,598 | 7/1992 | Verheyen et al. | 310/316 |
| 5,361,014 | 11/1994 | Antone et al. | 310/316 |
| 5,434,527 | 7/1995 | Antone | 327/391 |
| 5,438,489 | 8/1995 | Judy et al. | 361/191 |
| 5,467,240 | 11/1995 | Williamson et al. | 361/18 |
| 5,546,043 | 8/1996 | Pollmeier | 327/427 |
| 5,554,954 | 9/1996 | Takahashi | 327/546 |
| 5,625,305 | 4/1997 | Hwang | 327/78 |

*Primary Examiner*—My-Trang Nu Ton
*Attorney, Agent, or Firm*—R. Carl Wilbur; W. Bryan McPherson, III

[57] ABSTRACT

A high side driver circuit includes a command voltage source, a first switching transistor having a base connected to the command voltage source, an emitter connected to ground, and a collector connected to a second switching transistor base. The second switching transistor includes an emitter connected to an electrical energy source through an internal voltage source. A power transistor includes a gate connected to the second switching transistor collector through a resistor, a drain connected to the electrical energy source through a sense resistor, and a source connected to a load. A diagnostic circuit portion including a comparator establishes a diagnostic output voltage based upon the state of the power transistor and characteristics of the power transistor drain and source for indicating fault conditions of the driver circuit.

18 Claims, 1 Drawing Sheet

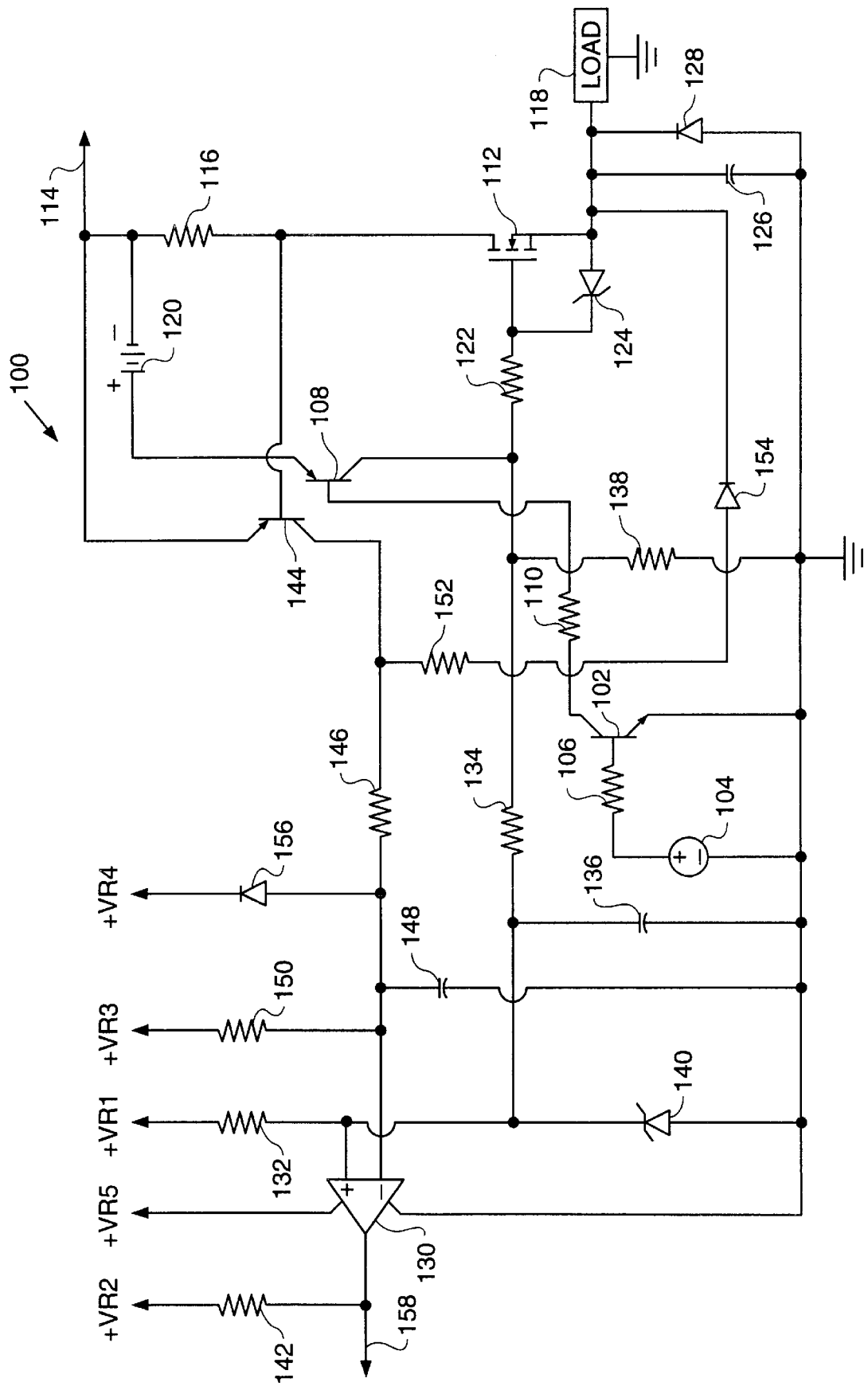

HIGH SIDE DRIVER CIRCUIT WITH DIAGNOSTIC OUTPUT

TECHNICAL FIELD

This invention relates generally to a driver circuit and, more particularly, to a high side driver circuit, with a diagnostic output, for driving resistive and inductive loads having high current requirements.

BACKGROUND ART

Driver circuits using bipolar junction transistors have been used to drive electrical loads in the past. However, such bipolar junction transistor-based driver circuits cannot effectively be used to drive loads requiring high currents of 2 amperes or more. Driver circuits capable of driving inductive and resistive loads with high current requirements are required in a variety of industrial applications, including electronically controlled heavy machinery. The term "high side" driver circuit is indicative of a circuit which drives a load by sourcing a current from an electrical energy source, such as a battery, to the load. It is also desirable to provide diagnostic output information from driver circuits, which diagnostic output information may be utilized by a digital controller. For example, such diagnostic output information is particularly desirable for detecting fault conditions such as a short circuit condition or an open circuit condition.

The present invention is directed to overcoming one or more of the problems as set forth above.

DISCLOSURE OF THE INVENTION

In one aspect of the present invention a driver circuit includes a command voltage source, a first switching transistor having a base connected to the command voltage source, an emitter connected to ground, and a collector connected to a second switching transistor base. The second switching transistor includes an emitter connected to an electrical energy source through an internal voltage source. A power transistor includes a gate connected to the second switching transistor collector through a resistor, a drain connected to the electrical energy source through a sense resistor, and a source connected to a load.

In another aspect of the present invention a driver circuit includes a power transistor having a drain connected to an electrical energy source through a sense resistor. A diagnostic portion of the driver circuit includes a comparator. A diagnostic output voltage is established at the output terminal of the comparator based upon the state of the power transistor and sensed characteristics of the power transistor drain and source for indicating fault conditions of the driver circuit.

In another aspect of the present invention a method of detecting a fault condition of a driver circuit including a power transistor having a drain, a gate and a source involves establishing a voltage indicative of whether the power transistor is on. Another voltage is established which is indicative of a characteristic of either the power transistor drain or the power transistor source. The two established voltages are compared and a diagnostic output voltage is established based upon the comparison.

BRIEF DESCRIPTION OF DRAWINGS

For a better understanding of the present invention, reference may be made to the accompanying drawings in which:

FIG. 1 shows a high side driver circuit associated with a preferred embodiment of the present invention.

BEST MODE FOR CARRYING OUT THE INVENTION

Referring now to the drawing, wherein a preferred embodiment of the present invention is shown, FIG. 1 illustrates a high side driver circuit 100. An npn switching transistor 102 includes a base connected to a command voltage source 104 through a resistor 106, and an emitter connected to ground. A pnp switching transistor 108 includes a base connected to the collector of the npn switching transistor 102 through a resistor 110. Resistor 106 may be selected to limit the current to the npn switching transistor base when the command voltage, which might typically be +5 volts, is applied, and to ensure that the npn switching transistor 102 is turned on hard when such command voltage is applied. Resistor 110 may be selected to limit the pnp switching transistor 108 base current and reduce the heat dissipation of transistors 102 and 108.

A power transistor 112, such as an N-channel MOSFET, includes a drain connected to an electrical energy source 114 through a sense resistor 116, and a source connected to a load 118 which is connected to ground. An internal voltage source 120 is connected between the electrical energy source 114 and the emitter of the pnp switching transistor 108. The collector of the pnp switching transistor 108 is connected to the power transistor gate through a resistor 122 which may be included to slow down the turn on of the power transistor 112. Throughout this specification the state of the driver circuit 100 is referred to as on or off, on referring to the state when transistors 102, 108, and 112 are turned on, such on state of the driver circuit 100 being effected by a positive command voltage. A zener diode 124 may be connected between the power transistor gate and the power transistor source as a power transistor current limiting means. The power transistor gate to source voltage is thus limited to the breakdown voltage of zener diode 124, establishing a maximum current which can flow through the power transistor 112 during an on state of the driver circuit 100. A capacitor 126 may be connected between the power transistor source and ground for electromagnetic interference protection and electrostatic discharge protection. A diode 128 may be connected between ground and the power transistor source for flyback current protection in the event that the load 118 is inductive in nature.

A diagnostic circuit portion includes a comparator 130 having a positive input terminal connected through a resistor 132 to a positive reference voltage +VR1. The positive input terminal is also connected to the power transistor gate. Such connection to the power transistor gate may be through a resistor 134 which is connected in series with resistor 122. A capacitor 136 may also be connected between the comparator positive input terminal and ground for reducing transient voltage spikes and noise to the positive input terminal. A resistor 138 includes a first side connected between resistor 134 and resistor 122 and a second side connected to ground. A zener diode 140 is also connected between the comparator positive input terminal and ground and may be selected to limit the voltage which can be applied to the comparator positive input terminal to a non-damaging level. An output terminal of the comparator 130 is connected through a resistor 142 to a positive reference voltage +VR2.

A pnp switching transistor 144 includes an emitter connected to the electrical energy source 114 and a base connected between the sense resistor 116 and the power transistor drain. A collector of the pnp switching transistor 144 is connected to the negative input terminal of comparator 130 through a resistor 146. A capacitor 148, having a first side connected to the comparator negative input terminal and a second side connected to ground, may be utilized for reducing transient voltage spikes and noise to the comparator negative input terminal. The negative input terminal of the comparator 130 is connected to a positive reference voltage +VR3 through a resistor 150, and is also connected to the power transistor source through resistor 146 and a resistor 152 and diode 154 connected in series, a cathode terminal of diode 154 being connected to the power transistor source and an anode terminal being connected to the resistor 152. Further, the negative input terminal of comparator 130 may also be connected to a positive reference voltage +VR4 through a diode 156 in order limit the voltage which can be applied to the negative input terminal to a non-damaging level, an anode terminal of diode 156 being connected to the comparator negative input terminal and a cathode terminal of diode 156 being connected to the reference voltage +VR4.

With respect to the comparator 130, such comparator may be an open collector type comparator having a ground terminal connected to ground, a positive voltage +VR5 being provided to power the comparator 130. A diagnostic output voltage 158 is established at the output terminal of the comparator 130 based upon the voltages at the positive and negative input terminals thereof.

Industrial Applicability

The operation of the present invention is now described by way of example. Driver circuit 100 may be utilized, for example, to drive a solenoid having a resistance of 6 ohms with a current of slightly less than 2 amperes from a +12 volt electrical energy source 114. Reference voltages +VR1 and +VR3 of +5 volts are also assumed.

When a positive command voltage is applied to the base of switching transistor 102, both switching transistor 102 and switching transistor 108 are switched on. The command voltage 104 might typically be provided from a digital controller or other logic means. The voltage level of the internal voltage source 120 is selected such that when switching transistor 108 is switched on, the power transistor 112 will also be turned on by the voltage applied to the gate, and may be, for example +10 volts above the voltage of the energy source 114. Thus, a positive command voltage on the order of +5 volts places the driver circuit 100 in an on state, the power transistor 112 being turned on and sourcing a current from the electrical energy source 114, through the sense resistor 116, through the power transistor 112 and to the load 118. When the command voltage is turned off, or set to 0 volts, all transistors 102, 108, and 112 are similarly turned off, placing the driver circuit 100 in an off state.

The pnp switching transistor 144 is utilized to identify an overcurrent condition, which will typically be indicative of a short circuit of the power transistor source to ground. If the turn on voltage ($V_{BE}$) of the pnp switching transistor 144 is about 0.65 volts and the resistance of sense resistor 116 is 0.2 ohms, the switching transistor 144 will turn on when the current through the sense resistor exceeds about 3.25 amperes. Of course, other resistance values could be selected for sense resistor 116 if some other overcurrent level is desired to be detected. Whenever an overcurrent is detected, the pnp switching transistor 144 will turn on and the voltage at the negative input terminal of comparator 130 will be the voltage of the electrical energy 114 minus the voltage drop across the switching transistor 144, or about +11.35 volts in this case. If the reference voltage +VR4 is about +13 volts it will have no affect on the voltage applied to the comparator negative input terminal. However, if a higher voltage electrical energy source was utilized in the driver circuit 100, say for example +24 volts, then when the pnp switching transistor 144 turned on the diode 156 would also turn on and the voltage applied to the negative input terminal would be limited to about +13.7 volts.

The voltage applied to the positive input terminal of the comparator 130 is established according to whether the driver circuit 100, and accordingly the power transistor 112, is on. When the power transistor 112 is off, the voltage applied to the positive input terminal is the voltage drop across resistors 134 and 138. Thus, resistors 132, 134, and 138 are selected, in combination with the reference voltage +VR1, to establish the voltage at the positive input terminal when the power transistor 112 is off. Given that +VR1 is +5 volts, if the respective values of resistors 132, 134 and 138 are 100 Kohms, 51 Kohms, and 100 Kohms, the off state voltage at the positive input terminal of comparator 130 is about +3 volts. When the driver circuit 100 is on, the voltage at the collector of switching transistor 108 will be close to the voltage of electrical energy source 114 plus the voltage of internal energy source 120, or in this case about +22 volts. This voltage causes zener diode 140 to be active, establishing the voltage at the positive input terminal of the comparator 130 at the breakdown voltage of the zener diode 140. Thus, the zener diode 140 is selected to establish the on state voltage at the positive input terminal of the comparator 130. For example, a zener diode 140 having a breakdown voltage of 6.8 volts may be selected.

Based upon the voltages established at the input terminals of the comparator 130, the diagnostic output voltage 158 is established. Being an open collector type comparator 130, if the voltage at the positive input terminal is greater than the voltage at the negative input terminal, the output terminal of the comparator 130 will be open circuited and the diagnostic output voltage 158 will be pulled to +VR2 through resistor 142. Such voltage +VR2 is selected to provide a digital high level and may therefore be +5 volts. If the voltage at the negative input terminal of the comparator 130 is greater than the voltage at the positive input terminal, the output terminal of the comparator 130 is connected to ground and the diagnostic output voltage 158 is pulled low to ground through the comparator 130.

The various modes of operation of the driver circuit 100 and corresponding diagnostic outputs are now described in view of the foregoing.

During normal operation with the load 118, if the driver circuit 100 is off the voltage established at the positive input terminal of comparator 130 will be about +3 volts. No current flows through the sense resistor 116 and therefore the switching transistor 144 is not turned on. The power transistor source is connected to load 118 and the negative input terminal of comparator 130 is connected to the power transistor source through resistors 146 and 152 and diode 154. The comparator negative input terminal voltage will therefore be approximately the sum of the voltage drops across resistors 146 and 152 and diode 154. Accordingly, reference voltage +VR3, and resistors 150, 146 and 152 are selected to establish the voltage at the comparator negative input terminal. Assuming that reference voltage +VR3 is +5 volts, resistor 150 is 100 Kohms, resistor 146 is 10 Kohms, resistor 152 is 10 Kohms and the voltage drop across diode 154 is about 0.5 volts, the voltage established at the negative input terminal of the comparator 130 is about +1.25 volts. Thus, during normal operation with the driver circuit 100 off, the voltage at the positive input terminal of comparator 130 is greater than the voltage at the negative input terminal, and the output terminal of comparator 130 is open circuited.

The diagnostic output voltage 158 is therefore pulled high to +5 volts through resistor 142. A high diagnostic output voltage indicates a no fault condition of the driver circuit 100.

During normal operation with the driver circuit 100 on, the voltage established at the positive input terminal of the comparator 130 will be the breakdown voltage of zener diode 140, in this case about +6.8 volts. The current through sense resistor 116 will be less than 3.25 amperes and therefore switching transistor 144 will not be turned on. Because a current is delivered through the load 118, the voltage level at the power transistor source will be the voltage level of the electrical energy source 114 minus the voltage drop across the sense resistor 116 and the power transistor 112, or about +11 volts in this case. This power transistor source voltage is blocked by diode 154, and no current flows through resistors 150, 146 and 152. The comparator negative input terminal is therefore pulled to +5 volts through resistor 150. The positive input terminal voltage of the comparator 130 is again greater than the negative input terminal voltage, resulting in a high diagnostic output voltage 158, indicating a no fault condition.

An open circuit fault condition is detected when the driver circuit 100 is off and no load 118 is connected to the circuit 100. If the driver circuit 100 is off, the voltage established at the positive input terminal of the comparator 130 is about +3 volts. With no current flowing through the sense resistor 116, the switching transistor 144 is also off. During an open circuit condition the power transistor source is open circuited such that no current flows through resistors 150, 146, and 152, and the comparator negative input terminal is therefore pulled to +5 volts through resistor 150. Because the voltage at the negative input terminal of the comparator 130 is greater than the voltage at the positive input terminal, the output terminal of the comparator 130 is connected to ground and the diagnostic output voltage 158 is pulled low to ground through the comparator 130. This digital low output level indicates a fault condition of the driver circuit 100. Note that if the driver circuit 100 is on during an open circuit condition, the voltage established at the positive input terminal of the comparator 130 is about +6.8 volts. The voltage at the negative input terminal is still +5 volts because the power transistor source voltage is about +12 volts which is blocked by diode 154, and no current flows through resistors 150, 146, and 152. The output terminal of the comparator 130 is therefore open circuited and the diagnostic output voltage 158 is pulled high to +5 volts through resistor 142. Accordingly, the open circuit fault condition is detected when the driver circuit 100 is off, but is not detected when the driver circuit 100 is on.

On the other hand, an overcurrent, which is indicative of a short circuit fault condition exists where either 1) the impedance of the load 118 is small enough to cause current through the sense resistor 116 to be greater than about 3.25 amps, or 2) a short circuit has caused current flow to bypass the load 118. With the driver circuit 100 on, the voltage established at the positive input terminal of the comparator 130 is about +6.8 volts. The current through the sense resistor 116 will exceed the overcurrent level of 3.25 amperes and, therefore, the switching transistor 144 will turn on establishing a voltage of about +11.35 volts at the negative input terminal of the comparator 130. Because the voltage at the negative input terminal of the comparator 130 is greater than the voltage at the positive input terminal, the diagnostic output voltage 158 is pulled low to ground through the comparator 130 indicating a fault condition of the driver circuit 100. However, if the driver circuit 100 is off during a short circuit condition, the voltage established at the positive input terminal of the comparator 130 is about +3 volts. No current flows through the sense resistor 116 because the power transistor 112 is off, and therefore the switching transistor 144 is not turned on. The power transistor source is connected to ground during a short circuit, and the voltage at the negative input terminal of the comparator 130 is therefore the sum of the voltage drops across resistors 146 and 152 and diode 154, or about +1.25 volts. Because the voltage at the positive input terminal of the comparator 130 is greater than the voltage at the negative input terminal, the diagnostic output voltage is pulled high to +5 volts through resistor 142, indicating no fault.

The driver circuit 100 provides a single diagnostic output voltage 158 which can indicate two different fault conditions. Such diagnostic output voltage can be provided to the logic means which controls the command voltage so that, if a low level diagnostic output voltage is detected, the driver circuit command voltage can be set to 0 volts to shut off the driver circuit 100. A fault signal can also be sent to other system devices. The nature of the fault condition is easily determined according to the state of the driver circuit 100 when the fault is detected as illustrated by the circuit diagnostics in Table 1 below.

TABLE 1

CIRCUIT DIAGNOSTICS

| DRIVER CIRCUIT CONDITION | DIAGNOSTIC OUTPUT LEVEL | INDICATION |
| --- | --- | --- |
| OFF | 0 | OPEN CIRCUIT |
| OFF | 1 | OK |
| ON | 0 | SHORT CIRCUIT |
| ON | 1 | OK |

Thus, according to the present invention, fault conditions of a driver circuit including a power transistor are detected by the following steps:

(a) sensing a characteristic of the power transistor drain;

(b) sensing a characteristic of the power transistor source;

(c) establishing a voltage indicative of at least one of the characteristics sensed in steps (a) and (b);

(d) establishing a voltage indicative of whether the power transistor is in an on state;

(e) comparing the voltage established in step (c) with the voltage established in step (d); and (f) establishing a diagnostic output voltage based upon the comparison made in step (e). When the voltage established in step (c) is greater than the voltage established in step (d), a digitally low diagnostic output voltage is established in step (f) to indicate a fault. If the driver circuit is off the low diagnostic output level is indicative of an open circuit fault condition and if the driver circuit is on the low diagnostic output level is indicative of a short circuit fault condition. The characteristic sensed in step (a) is whether the current flowing into the power transistor exceeds an overcurrent level. The characteristic sensed in step (b) may be the voltage of the power transistor source or an open circuit condition of the power transistor source. Referring to the driver circuit 100, if the power transistor source voltage is high or if the power transistor source is open circuited, no current will flow through the path which includes diode 154. On the other hand, if the power transistor voltage is low, less than about +0.5 volts, and the power transistor source is not open circuited, current will flow through the path which includes diode 154.

Other aspects, objects and advantages of this invention can be obtained from a study of the drawings, the disclosure and the appended claims.

We claim:

1. A driver circuit, comprising:

a command voltage source;

an npn switching transistor having a collector, a base and an emitter, the base connected to the command voltage source, the emitter connected to ground;

a pnp switching transistor having a collector, a base, and an emitter, the base connected to the npn switching transistor collector;

an electrical energy source;

an internal voltage source connected between the electrical energy source and the pnp switching transistor emitter;

a power transistor having a drain, a source, and a gate, the drain connected to the electrical energy source through a sense resistor, the source connected to a load; and a first resistor connected between the pnp switching transistor collector and the power transistor gate.

2. A driver circuit, as set forth in claim 1, further comprising:

a diagnostic circuit portion for indicating the occurrence of a fault condition in the driver circuit, the diagnostic circuit portion including:

a comparator having a positive input terminal, a negative input terminal, an output terminal, and a ground terminal, the positive input terminal connected to a first reference voltage, the negative input terminal connected to a second reference voltage, the ground terminal connected to ground;

a second pnp switching transistor having a collector, a base, and an emitter, the base connected between the sense resistor and the power transistor drain, the emitter connected to the electrical energy source, and the collector connected to the comparator negative input terminal;

a second resistor connected in series with the first resistor between the power transistor gate and the comparator positive input terminal; and a first zener diode connected between the comparator positive input terminal and ground.

3. A driver circuit, as set forth in claim 2, wherein the diagnostic circuit portion further includes:

a first diode having an anode terminal and a cathode terminal, the cathode terminal connected to the power transistor source, the anode terminal connected to the second pnp switching transistor collector through a third resistor; and a fourth resistor having a first side connected between the first resistor and the second resistor and a second side connected to ground.

4. A driver circuit, as set forth in claim 3, wherein the diagnostic circuit portion further includes:

a second diode having an anode terminal connected to the comparator negative input terminal and a cathode terminal connected to a third reference voltage.

5. A driver circuit, as set forth in claim 4, further comprising:

a second zener diode connected between the power transistor gate and the power transistor source;

a first capacitor having a first side connected to the power transistor source and a second side connected to ground; and a third diode connected in parallel with the first capacitor.

6. A driver circuit, as set forth in claim 1, wherein the power transistor is an N-channel MOSFET.

7. A driver circuit, comprising:

an electrical energy source;

a power transistor including a drain, a gate, and a source, the source connected to a load;

a sense resistor connected between the electrical energy source and the power transistor drain;

a first switching transistor having an emitter, a base, and a collector, the emitter connected to the electrical energy source, the base connected between the sense resistor and the power transistor drain; and a comparator including a positive input terminal, a negative input terminal and an output terminal, the positive input terminal connected with the power transistor gate, the negative input terminal connected with the first switching transistor collector and with the power transistor source.

8. A driver circuit, as set forth in claim 7, wherein the comparator negative input terminal is connected with the power transistor source through a first diode.

9. A driver circuit, as set forth in claim 8, further comprising:

a first resistor connected between the comparator negative input terminal and the switching transistor collector;

a second resistor connected between the comparator positive input terminal and the power transistor gate;

a third resistor having a first side connected between the second resistor and the power transistor gate and a second side connected to ground; and a first zener diode connected between the comparator positive input terminal and ground.

10. A driver circuit, as set forth in claim 9, further comprising:

a fourth resistor connected between the comparator positive input terminal and a first reference voltage; and a fifth resistor connected between the comparator negative input terminal and a second reference voltage.

11. A driver circuit, as set forth in claim 10, further comprising:

a second switching transistor and an internal voltage source connected in series between the electrical energy source and the power transistor gate;

a command voltage source associated with the base of the second switching transistor for controlling the switching thereof; and a second zener diode connected between the power transistor gate and the power transistor source.

12. A method of detecting a fault condition of a driver circuit including a power transistor having a drain, a gate and a source, the method comprising the steps of:

(a) sensing a characteristic of the power transistor drain;

(b) sensing a characteristic of the power transistor source;

(c) establishing a voltage indicative of at least one of the characteristics sensed in steps (a) and (b);

(d) establishing a voltage indicative of whether the power transistor is in an on state;

(e) comparing the voltage established in step (c) with the voltage established in step (d); and (f) establishing a diagnostic output voltage based upon the comparison made in step (e).

13. A method, as set forth in claim 12, wherein the characteristic of the power transistor drain sensed in step (a) is whether the current flowing into the power transistor exceeds a predetermined level.

14. A method as set forth in claim 12, wherein the characteristic of the power transistor source sensed in step (b) is a voltage of the power transistor source.

15. A method as set forth in claim 12, wherein the characteristic of the power transistor source sensed in step (b) is an open circuit condition thereof.

16. A method, as set forth in claim 12, wherein, if the voltage established in step (c) is greater than the voltage established in step (d), the diagnostic output voltage established in step (f) is indicative of a fault condition of the driver circuit.

17. A method, as set forth in claim 16, wherein, a fault indicative voltage established at step (f) is indicative of a first fault condition if the power transistor is on and is indicative of a second fault condition if the power transistor is off.

18. A method, as set forth in claim 17, wherein the first fault condition is a short circuit condition and the second fault condition is an open circuit condition.

* * * * *